United States Patent
Watt

(10) Patent No.: US 6,562,675 B1
(45) Date of Patent: May 13, 2003

(54) ADJUSTMENT OF THRESHOLD VOLTAGES OF SELECTED NMOS AND PMOS TRANSISTORS USING FEWER MASKING STEPS

(75) Inventor: Jeffrey T. Watt, Palo Alto, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/932,159

(22) Filed: Aug. 17, 2001

(51) Int. Cl.[7] .......................................... H01L 21/8238
(52) U.S. Cl. ........................ 438/217; 438/276; 438/289
(58) Field of Search ................................. 438/217, 218, 438/223, 276, 289, 221, 224; 257/391, 392, 402, 403, 404

(56) References Cited

U.S. PATENT DOCUMENTS

| | | | | |
|---|---|---|---|---|
| 5,989,949 A | * | 11/1999 | Kim et al. ................... | 438/217 |
| 6,043,128 A | * | 3/2000 | Kamiya ....................... | 438/289 |
| 6,090,652 A | * | 7/2000 | Kim ............................ | 438/199 |
| 6,228,697 B1 | * | 5/2001 | Furukawa et al. .......... | 438/202 |

* cited by examiner

Primary Examiner—Wael Fahmy
Assistant Examiner—Hoai Pham
(74) Attorney, Agent, or Firm—Kevin L. Daffer; Conley, Rose P.C.

(57) ABSTRACT

A method is provided for processing a semiconductor topography. In particular, a method is provided for decreasing the threshold voltage magnitude of a first transistor being formed within the substrate while simultaneously increasing the threshold voltage magnitude of a second transistor being formed within the substrate. In some embodiments, a width of the first transistor may be larger than a width of the second transistor. In addition or alternatively, the method may include performing a first implantation corresponding to a threshold voltage magnitude above a desired value for the first transistor. The method may further include performing a second implantation to simultaneously lower the threshold voltage magnitude of the first transistor and raise a threshold voltage magnitude of the second transistor. In some embodiments, the method may include introducing dopants of a first conductivity type into a first transistor channel dopant region and a second transistor channel dopant region simultaneously.

24 Claims, 6 Drawing Sheets

ADJUSTMENT OF THRESHOLD VOLTAGES OF SELECTED NMOS AND PMOS TRANSISTORS USING FEWER MASKING STEPS

BACKGROUND OF THE INVENTION

1. Field of the Invention

This invention relates to semiconductor device manufacturing, and more particularly, to an improved method for processing a semiconductor substrate.

2. Description of the Related Art

The following descriptions and examples are not admitted to be prior art by virtue of their inclusion within this section.

In the fabrication of metal-oxide-semiconductor ("MOS") transistors, source and drain regions may be doped to an opposite conductivity type (either n-type or p-type) than the substrate. N-type source/drain regions may be used to form n-channel transistors and p-type source/drain regions may be used to form p-channel transistors. In complementary MOS ("CMOS") circuits, however, both n-channel and p-channel transistors are formed within the same substrate. Consequently, wells may be formed by selectively doping the region of the substrate underlying the subsequently formed gate conductors to allow a substrate of either conductivity type to be used. In general, wells may be doped to an opposite conductivity type than that of the source and drain regions. In this manner, n-channel transistors may be formed in p-type wells, while p-channel transistors may be formed in n-type wells. In some cases, additional dopants may be introduced into the substrate to form channel dopant regions within the wells. Preferably, the channel dopant regions may be the same conductivity type as the wells in which they reside. In general, channel dopant regions may be used to prevent punch-through and short channel effects of subsequently formed transistors.

In addition, the fabrication of MOS transistors typically includes the formation of isolation structures between the active areas of the device. In general, the isolation structures may define the field regions of the semiconductor substrate, while the area including the well regions and channel dopant regions may define the active areas of the substrate. One isolation technology used in the fabrication of integrated circuits involves local oxidation of silicon ("LOCOS"). In LOCOS processes, an oxide layer may be grown upon a silicon substrate and a silicon nitride ("nitride") layer may be arranged upon the oxide layer. The surfaces of the field regions upon the silicon substrate may then be exposed by etching portions of the nitride layer and the oxide layer. Remaining portions of the nitride layer and oxide layer may cover active regions of the silicon substrate, thereby serving as a mask to prevent oxidation of these regions in subsequent steps. An implant may then be performed in the field region to create a channel-stop doping layer and the exposed portion of the silicon substrate within the field region may be oxidized. By growing a thick oxide film within isolation (or field) regions pre-implanted with a channel-stop dopant, LOCOS processing may help prevent the establishment of parasitic channels in the field regions.

Although LOCOS has remained a popular isolation technology, the LOCOS process described above has several problems. When growing the field oxide, oxide growth should ideally be contained within the field region. In reality, however, some oxide growth may occur in a lateral direction, causing the field oxide to grow under and lift the edges of the nitride layer. Because the shape of the field oxide at the nitride edges is that of a slowly tapering wedge that merges into the pad oxide, the wedge is often described as a bird's beak. In many instances, formation of the bird's beak can cause unacceptable encroachment of the field oxide into the active regions. In addition, the high temperatures associated with field oxide growth often cause the pre-implanted channel-stop dopant to migrate towards adjacent active regions. An increase in the dopant concentration near the edges of the field oxide can create a reduction in the drain current, an outcome that is often described as the narrow-width effect. Furthermore, thermal oxide growth is significantly less in small field regions (i.e., field areas of narrow lateral dimension) than in large field regions. Because of this reduction in oxide growth, an undesirable phenomenon known as the field-oxide-thinning effect may occur in small field regions. Field-oxide-thinning can produce problems with respect to field threshold voltage magnitudes, interconnect-to-substrate capacitance, and field-edge leakage in small field regions between closely spaced active areas.

Despite advances made to decrease the bird's beak, channel-stop encroachment and non-planarity problems, it appears that LOCOS technology is still inadequate for sub-micron technologies. Many of the problems associated with LOCOS technology may be alleviated by an isolation technique known as trench isolation. A trench isolation fabrication process typically includes an initial step in which a trench is etched within a silicon substrate. The trench may then be filled with a dielectric, such as silicon dioxide. Some trench isolation processes also include an intermediate step of growing oxide on the trench floor and sidewalls before filling the trench with the dielectric. After the trench is filled, the upper surface of the dielectric may then be made coplanar with the upper surface of the silicon substrate to complete the fabrication of the isolation structure. The trench isolation process eliminates many of the problems of LOCOS techniques, including bird's beak and channel-stop dopant redistribution. Trench isolation processes are also better suited than LOCOS processes for isolating densely spaced active devices having field regions less than one micron wide. In addition, trench isolation structures formed by trench isolation processes may be fully recessed, offering at least the potential for a planar surface. Moreover, field-oxide thinning in narrow isolation spaces is less likely to occur when using a trench isolation process.

Despite their many advantages over LOCOS techniques, trench isolation processes nevertheless have their own set of drawbacks. In particular, the threshold voltage magnitude, $V_T$, of a transistor separated by trench isolation structures may decrease as the width of the transistor decreases. Such a phenomenon is sometimes referred to as the inverse narrow width effect ("INWE"). In contrast, the threshold voltage magnitude of transistors separated by isolation regions fabricated from techniques other than trench isolation processes may increase as the width of the transistor decreases. It is postulated that the INWE may be related to fields generated by transistors and concentrated at sharp corners between the silicon substrate and trench isolation structures. In addition or alternatively, the INWE may be influenced by the diffusion of dopant atoms from the silicon into the isolation structures, thereby reducing the dopant concentration of the channel dopant regions of the transistors. In other cases, the isolation regions may extend below the active region of the silicon, forming a channel along the side of the active region. Each of these conditions, either independently or in combination, may result in a decrease of the threshold voltage magnitude of a subsequently formed transistor.

A threshold voltage magnitude lower than its design value is undesirable because leakage current is typically increased as threshold voltage magnitude is decreased. Conversely, high threshold voltage magnitudes may have an undesirable effect on performance of the circuit, particularly at low supply voltages. Therefore, it may be beneficial to maintain transistor threshold voltage magnitudes within predetermined ranges. Consequently, as transistor widths continue to decrease and the use of trench isolation techniques becomes more prevalent, methods for adjusting the threshold voltage magnitude of transistors will become increasingly necessary. One method of adjusting the threshold voltage magnitude of a transistor is to implant a greater concentration of impurities into the channel dopant region of a subsequently formed transistor. However, the INWE is dependent on the width of the transistor and therefore, relatively wide transistors may not be affected by the NWE as much as the narrow-width transistors. Implanting an increased concentration of impurities into channel dopant regions of subsequently formed relatively wide transistors may lead to an unnecessarily large threshold voltage magnitude for those transistors, which may degrade their performance. Therefore, the implantation of a greater concentration of impurities into channel dopant regions may be appropriate only for the narrow-width transistors.

As a result, the implantation of additional impurities may be cumbersome, time-consuming, and costly when transistors of different conductivity types and sizes are fabricated into the same integrated circuit. For example, narrow-width CMOS transistors (i.e. transistors with a width of less than approximately 1 micron) are sometimes fabricated along with relatively wide CMOS transistors (i.e. transistors with a width of greater than approximately 1 micron) within the same integrated circuit. A fabrication process for such a device may require at least four masking layers in order to form channel dopant regions with the appropriate impurity concentrations such that transistors with the appropriate threshold voltage magnitudes may be subsequently formed. For instance, the fabrication process may require a different masking layer for the formation of each channel dopant region (e.g., narrow NMOS, wide NMOS, narrow PMOS, and wide PMOS channel dopant regions). Alternatively, the fabrication process may include forming the PMOS transistor channel dopant regions with one masking layer and the NMOS transistor channel dopant regions with another masking layer, and then using two separate masking layers to implant additional impurities to increase or decrease the threshold voltage magnitudes of the subsequently formed transistors.

Accordingly, it would be advantageous to develop a method for forming a CMOS integrated circuit with differing transistor widths and conductivity types and comparable threshold voltage magnitudes. In particular, it would advantageous to form such an integrated circuit using fewer masking layers than conventional methods.

SUMMARY OF THE INVENTION

The problems outlined above may be in large part addressed by a method for processing a semiconductor substrate. In particular, a method is provided for decreasing the threshold voltage magnitude of a first transistor being formed within the substrate while simultaneously increasing the threshold voltage magnitude of a second transistor being formed within the substrate. In some embodiments, a width of the first transistor may be larger than a width of the second transistor. In addition or alternatively, the method may include performing a first implantation corresponding to a threshold voltage magnitude above a desired value for a first transistor. Such a method may further include performing a second implantation to simultaneously lower the threshold voltage magnitude of the first transistor and raise a threshold voltage magnitude of a second transistor. In some embodiments, the method may include introducing compensation dopants of a first conductivity type into a first transistor channel dopant region and a second transistor channel dopant region simultaneously. In such an embodiment, a net concentration of electrically active impurities within the first transistor channel dopant region may be greater than a net concentration of electrically active impurities within the second transistor channel dopant region prior to introducing the compensation dopants.

Consequently, an integrated circuit is provided which includes a first transistor formed upon a first channel dopant region having implanted impurities of both conductivity types. In particular, the first channel dopant region may include a greater concentration of implanted impurities of one conductivity type than a concentration of implanted impurities of the other conductivity type. In addition, the integrated circuit may include a second transistor formed upon a second channel dopant region having implanted impurities of the other conductivity type. In some embodiments, the width of the second transistor may be smaller than a width of the first transistor.

In an embodiment, the method described herein may include performing a first implantation corresponding to a threshold voltage magnitude above a desired value for a first transistor. Such a first implantation may include introducing dopants of a first conductivity type into exposed portions of the semiconductor substrate to form a channel dopant region for the first transistor. As such, the first transistor may be subsequently fabricated within a portion of the substrate receiving the first implantation. In addition, the method may include performing a second implantation to simultaneously lower the threshold voltage magnitude of the first transistor and raise a threshold voltage magnitude of a second transistor. The second implantation may include introducing dopants of a second conductivity type into the channel dopant regions of the first and second transistors. In particular, the second implantation may include implanting a large enough concentration of impurities to counteract an inverse narrow width effect on the threshold voltage magnitude of the second transistor.

The method may further include performing a third implantation prior to the second implantation corresponding to a threshold voltage magnitude below a desired value of the second transistor. In particular, the third implantation may be conducted before or after the first implantation. Such a third implantation may include introducing dopants of the second conductivity type into exposed portions of the semiconductor substrate to form a channel dopant region for the second transistor. As such, the second transistor may be subsequently fabricated within a portion of the substrate receiving the third implantation. In a preferred embodiment, the second conductivity type is opposite of the first conductivity type. Moreover, a dose of the dopants of the first conductivity type may be approximately 0.5 times smaller to approximately 2.0 times larger than a dose of the dopants of the second conductivity type during the third implantation. Larger and smaller dose variations may be appropriate, however, depending on the design specifications of the device. In some embodiments, a width of the second transistor may be smaller than a width of the first transistor.

More generally, the method may include interchanging the first, second, and third implantations such that a threshold voltage magnitude of a first transistor subsequently formed within the substrate may be decreased while the threshold voltage magnitude of a second transistor subsequently formed within the substrate may be increased. In this manner, the reference of the 1st, 2nd, and 3rd implantations may not indicate the order in which the implantations are performed but rather distinguish the functions of implantations from each another. For example, the second implantation may be introduced prior to either of the first and third implantations. In such an embodiment, the second implantation may include introducing dopants into exposed portions of the substrate to form channel dopant regions for the first and second transistor. The introduction of the first and third implantations, in such an embodiment, may be interchanged such that they are conducted before or after one another. In an embodiment in which the first implantation includes the opposite conductivity type as the second implantation, the first implantation may include changing the net conductivity type of one of the channel dopant regions created by the second implantation. In an embodiment in which the third implantation includes the same conductivity type as the second implantation, the third implantation may be introduced into another of the channel dopant regions created by the second implantation to raise the threshold voltage of the transistor subsequently formed within the channel dopant region. In addition, the first and third implantations may include forming additional channel dopant regions of their respective conductivity type.

In an alternative embodiment, the second implantation may be introduced between the first and third implantations. In this manner, the sequence of implantations may include the first implantation followed by the second and third implantations, respectively. In such an embodiment, the second implantation may include lowering the threshold voltage magnitude of a first transistor subsequently formed within the channel dopant region formed by the first implantation. In addition, the second implantation may include introducing dopants into exposed portions of the substrate to form a channel dopant region for the second transistor. The third implantation may follow to increase the threshold voltage magnitude of the second transistor and form an additional channel dopant region of its respective conductivity type. Alternatively, the sequence of implantations may include the third implantation followed by the second and first implantations, respectively. In this manner, the second implantation may include raising the threshold voltage magnitude of a second transistor subsequently formed within the channel dopant region formed by the third implantation. In addition, the second implantation may include introducing dopants into exposed portions of the substrate to form channel dopant regions for the first transistor. The first implantation may follow to change the conductivity type of the channel dopant region formed by the second implantation for the first transistor. In addition, the first implantation may form another channel dopant region of its respective conductivity type.

In an embodiment, the method described herein may include decreasing the threshold voltage magnitude of a first transistor being formed within the substrate while simultaneously increasing the threshold voltage magnitude of a second transistor being formed within the substrate. In such an embodiment, decreasing the threshold voltage magnitude may include decreasing a net concentration of electrically active impurities of a first conductivity type within a channel dopant region of the first transistor. Increasing the threshold voltage magnitude, on the other hand, may include increasing the concentration of impurities of a second conductivity type within a channel dopant region of the second transistor. In some embodiments, increasing the concentration of impurities of the second conductivity type may include increasing the concentration of impurities by an amount between approximately 20% and approximately 100%. In addition or alternatively, increasing the threshold voltage magnitude of the second transistor may include increasing the threshold voltage magnitude by an amount between approximately 25 mV and approximately 300 mV.

In some embodiments, the second transistor may be a memory cell transistor, while the first transistor may be a non-memory cell transistor. In addition or alternatively, a width of the first transistor may be larger than a width of the second transistor. More specifically, the width of the first transistor may be at least approximately 2 times larger than the width of the second transistor. In some embodiments, the width of the first transistor may be at least approximately 100 times larger than the width of the second transistor. Alternatively, the width of the first transistor may be approximately the same width as the second transistor in some embodiments.

As stated above, a method for processing a semiconductor substrate is provided. Such a method may include introducing compensation dopants of a first conductivity type into a first transistor channel dopant region and a second transistor channel dopant region, simultaneously. In some embodiments, a net concentration of electrically active impurities within the first transistor channel dopant region may be greater than a net concentration of electrically active impurities within the second transistor channel dopant region prior to introducing the compensation dopants. Alternatively, the net concentration of electrically active impurities within the first transistor channel dopant region may be equal to or less than a net concentration of electrically active impurities within the second transistor channel dopant region prior to introducing the compensation dopants. In addition, the impurities of the first transistor channel dopant region prior to the introduction of the compensation dopants may include a net conductivity type opposite to that of the compensation dopants. On the contrary, the impurities of the second transistor channel dopant region prior to the introduction of the compensation dopants may include the same net conductivity type as the compensation dopants.

The method may further include introducing first channel dopants of the first conductivity type into the semiconductor substrate to form the first transistor channel dopant region. Such an implantation of first channel dopants may further form a third transistor channel dopant region of the same conductivity type as the first transistor channel dopant region. In addition, the method may include introducing second channel dopants of a second conductivity type into the semiconductor substrate to form the second transistor channel dopant region. Such an implantation of second channel dopants may further form a fourth transistor channel dopant region of the same conductivity type as the second transistor channel dopant region. Preferably, the second conductivity type is opposite to that of the first conductivity type. Moreover, introducing the first and second channel dopants may include implanting. In such an embodiment, a dose of the first channel dopants may be larger than a dose of the second channel dopants. Alternatively, the dose of the first channel dopants may be smaller than the dose of the second channel dopants.

The method may further include forming a patterned layer over the second transistor channel dopant region and the fourth transistor channel dopant region prior to introducing the first channel dopants. In addition or alternatively, the method may include forming a patterned layer over the first transistor channel dopant region and the third transistor channel dopant region prior to introducing the second channel dopants. In some embodiments, the method may include forming a patterned layer over the third transistor channel dopant region and the fourth transistor channel dopant region prior to introducing the compensation dopants. Introducing the compensation dopants may include increasing the threshold voltage magnitude of a subsequently formed transistor arranged above the second transistor channel dopant region by an amount between approximately 25 mV and approximately 300 mV. In addition or alternatively, introducing the compensation dopants may include decreasing the threshold voltage magnitude of a subsequently formed transistor arranged above the first transistor channel dopant region. In either embodiment, introducing the compensation dopants may include increasing the concentration of the second transistor channel dopant region by an amount between approximately 20% and approximately 100%.

In an embodiment, the method as described herein may be used to form an integrated circuit. Such an integrated circuit may include a first transistor with a first channel dopant region having implanted impurities of both conductivity types. More specifically, the first channel dopant region may include a greater concentration of implanted impurities of one conductivity type than a concentration of implanted impurities of the other conductivity type. In addition, the integrated circuit may include a second transistor with a second channel dopant region having implanted impurities of the same conductivity type as the impurities having the lesser concentration within the first channel dopant region. In some embodiments, a width of the second transistor may be smaller than a width of the first transistor.

Furthermore, the integrated circuit may include a third transistor with a third channel dopant region having implanted impurities of the same conductivity type as the impurities having the greater concentration within the first channel dopant region. In some cases, a width of the third transistor may be smaller than the width of the first transistor. Furthermore, the first and third transistors may include non-memory transistors. Moreover, the integrated circuit may further include a fourth transistor with a fourth channel dopant region having implanted impurities of the same conductivity type as the impurities having the lesser concentration within the first channel dopant region. In some cases, a width of the fourth transistor may be larger than the width of the second transistor. In some embodiments, the second and fourth transistors may include memory cell transistors.

The method described herein may offer several benefits. In particular, transistors of differing widths and conductivity types and comparable threshold voltage magnitudes may be formed within the same integrated circuit. For example, CMOS transistors of a narrow width may be formed along with CMOS transistors with a relatively larger width and have substantially the same threshold voltage magnitude. Moreover, narrow-width CMOS transistors may be formed to a desired threshold voltage magnitude without undesirably increasing the threshold voltage magnitude of the relatively larger-width CMOS transistors. Furthermore, channel dopant regions of such transistors may be formed in three or fewer masking layers. This is distinctly different from conventional methods for forming an integrated circuit with transistors of comparable threshold voltage magnitudes and differing widths and conductivity types. Such methods generally require four or more masking layers to fabricate such an integrated circuit. The reduction in the number of masking layers required may reduce fabrication costs and processing time, thereby increasing production throughput. In addition, the inverse narrow width effect of transistors formed between trench isolation structures may be counteracted with the method as described herein.

BRIEF DESCRIPTION OF THE DRAWINGS

Other objects and advantages of the invention will become apparent upon reading the following detailed description and upon reference to the accompanying drawings in which.

Figure 1:
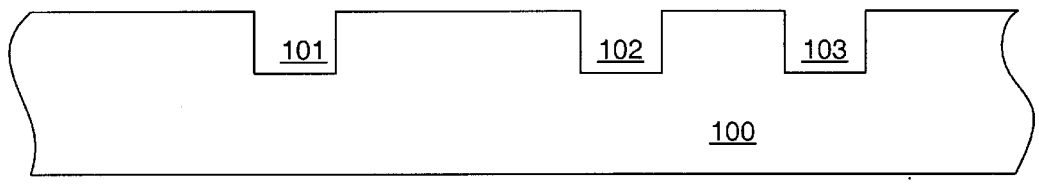
FIG. 1 depicts a partial cross-sectional view of a semiconductor topography in which trenches are formed within a substrate.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Turning to the drawings, exemplary embodiments of a method for processing a semiconductor substrate are shown in FIGS. 1–17. FIG. 1 depicts a semiconductor topography in which trenches 101, 102, and 103 are formed within substrate 100. Substrate 100 may be a silicon substrate, and may in some embodiments be doped either n-type or p-type. More specifically, substrate 100 may be a monocrystalline silicon substrate or an epitaxial silicon layer grown on a monocrystalline silicon substrate. In addition, substrate 100 may include a silicon on insulator (SOI) layer, which may be formed upon a silicon wafer. Trenches 101, 102, and 103 may be formed by etching exposed portions of substrate 100. In particular, a photoresist layer (not shown) may be patterned upon substrate 100 prior to etching the trenches. Such a patterning step may expose portions of substrate 100, thus allowing trenches 101, 102, and 103 to be formed as shown in FIG. 1. The etch process may include wet etch and/or dry etch techniques. Subsequent to the etch process, the patterned photoresist layer may be removed by a stripping process such as a wet etch or a reactive ion etch stripping process. Although FIG. 1 illustrates the formation of three trenches across the illustrated portion of substrate 100, any number of trenches may be formed across the substrate in accordance with design specifications of the integrated circuit. In addition, various widths and depths of the trenches may be formed in accordance with the design specifications of the integrated circuit.

Consequently, trenches 101, 102, and 103 may be patterned in a configuration such that transistors of differing widths may be subsequently fabricated in the regions of substrate 100 interposed between the trenches. For example, the region of substrate 100 between trenches 101 and 102 may be wider than the region of substrate 100 interposed between trenches 102 and 103. In this manner, transistors with a larger width may be fabricated between trenches 101 and 102 than between trenches 102 and 103. More specifically, a width of a transistor formed between trenches 101 and 102 may be at least approximately 2 times larger than a width of a transistor formed between trenches 102 and 103. In some embodiments, the width of a transistor formed between trenches 101 and 102 may be at least approximately 100 times larger than the width of transistor formed between trenches 102 and 103. Alternatively, the width of a transistor between trenches 101 and 102 may be approximately the same width as a transistor between trenches 102 and 103. In some embodiments, the width of the spacing between trenches 101 and 102 may continue to the left for other trench spacings and therefore transistors of similar widths. Likewise, the width of the spacing between trenches 102 and 103 may continue to the right for other trench spacings and transistors of similar widths. For example, an array of memory transistors may be fabricated within a region including a plurality of adjacent trench spacings similar to the spacing between trenches 102 and 103. Numerous other spacing configurations of trenches 101, 102, and 103, however, may be used depending on the design specifications of the integrated circuit. For example, trenches 101, 102, and 103 may be spaced such that a larger region of substrate 100 is interposed between trenches 102 and 103 rather than between trenches 101 and 102. Alternatively, trenches 101, 102, and 103 may be uniformly spaced across substrate 100.

Figure 2:
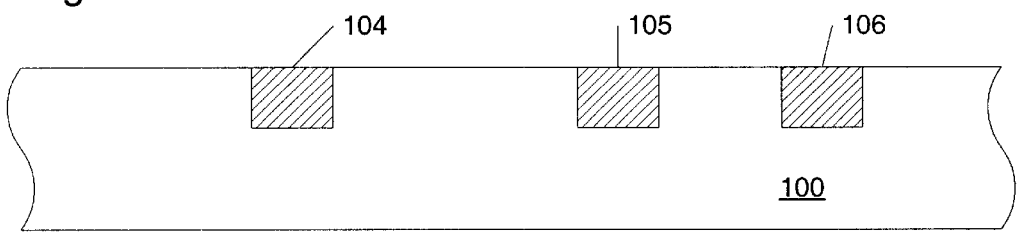
FIG. 2 depicts a partial cross-sectional view of the semiconductor topography in which isolation structures are formed within the trenches of FIG. 1.

Trenches 101, 102, and 103 may be used to form trench isolation regions 104, 105, and 106 respectively within substrate 100 as shown in FIG. 2. Isolation regions 104, 105, and 106 may be field oxide regions that may serve to isolate separate active regions on and within substrate 100 from one another. Isolation regions 104, 105, and 106 may be formed by a number of techniques such as shallow trench isolation (STI) or recessed oxide isolation (ROI). For example, during the process of STI, an insulative material, such as undoped silicon dioxide may be deposited across the topography of FIG. 1, filling trenches 101, 102, and 103. The resulting topography may then be planarized to remove the material residing upon the upper surfaces of substrate 100. In an embodiment, the upper surfaces of isolation regions 104, 105, and 106 may be substantially coplanar with the upper surface of substrate 100 as shown in FIG. 2. Alternatively, the upper surfaces of isolation region 104, 105, and 106 may be above or below the upper surface of substrate 100. In an alternative embodiment, isolation regions 104, 105, and 106 may be formed by local oxidation of silicon (LOCOS). In such an embodiment, trenches 101, 102, and 103 may not be formed prior to the formation of isolation regions 104, 105, and 106 as shown in FIG. 1. In addition, isolation regions formed by LOCOS may be arranged upon substrate 100, partially recessed within substrate 100, or fully recessed within substrate 100.

Figure 3:
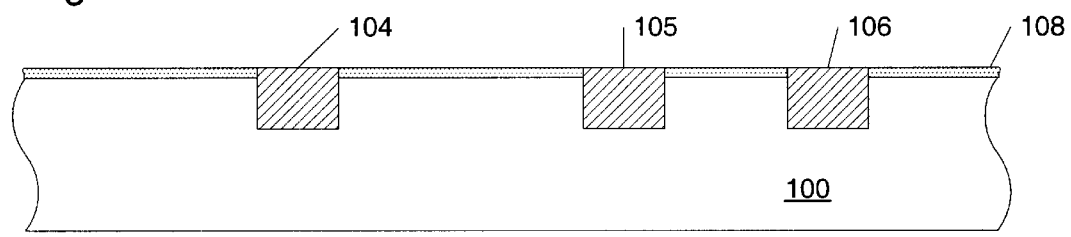
FIG. 3 depicts a partial cross-sectional view of the semiconductor topography in which an oxide layer is formed within the upper surface of the substrate subsequent to the isolation structure formations of FIG. 2.

In some embodiments, dielectric 108 may be arranged upon the upper surface of substrate 100 as shown in FIG. 3. More specifically, dielectric 108 may be thermally grown or deposited upon the upper surfaces of substrate 100 adjacent to isolation regions 104, 105, and 106. In some cases, dielectric 108 may be deposited upon the upper surface of isolation regions 104, 105, and 106 (not shown). Dielectric 108 may serve to protect the underlying substrate during subsequent processing. Dielectric 108 may include, for example, silicon dioxide ($SiO_2$), silicon nitride ($Si_xN_y$), silicon oxynitride ($SiO_xN_y(H_z)$), or silicon dioxide/silicon nitride/silicon dioxide (ONO). In an alternative embodiment, dielectric 108 may be omitted from the topography.

Figure 4:
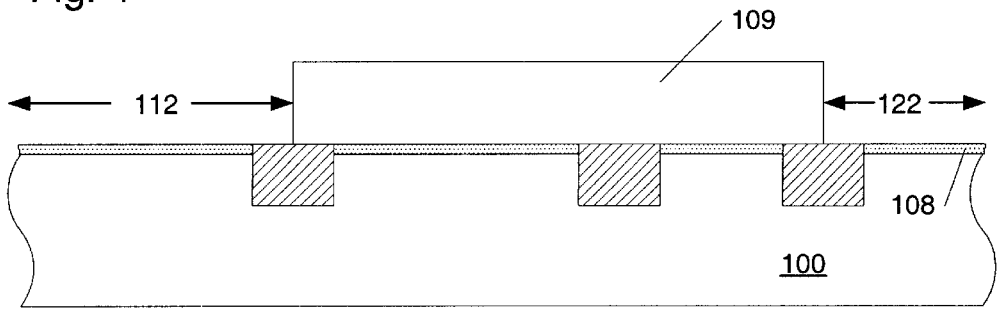
FIG. 4 depicts a partial cross-sectional view of the semiconductor topography in which a patterned layer is formed upon the substrate subsequent to the oxide layer formation of FIG. 3.

Patterned layer 109 may be formed upon a portion of dielectric 108 and/or isolation regions 104, 105, and 106 as shown in FIG. 4. Alternatively, patterned layer 109 may be formed upon a portion of substrate 100 and/or isolation regions 104, 105, and 106 when dielectric 108 is omitted. Patterned layer 109 may include a photoresist layer such as a deep ultraviolet resist, an I-line resist, a G-line resist, or another resist, such as an e-beam resist or an x-ray resist. Alternatively, patterned layer 109 may include any material compatible with semiconductor fabrication that may be effectively patterned over a substrate. Patterned layer 109 may be formed by lithography techniques known to those skilled in the art. More specifically, patterned layer 109 may be formed such that regions 112 and 122 of the semiconductor topography may be exposed. In this manner, patterned layer 109 may serve as a masking layer for subsequent processing. In particular, patterned layer 109 may serve to prevent the introduction of impurities in the respective underlying portion of substrate 100.

Figure 5:
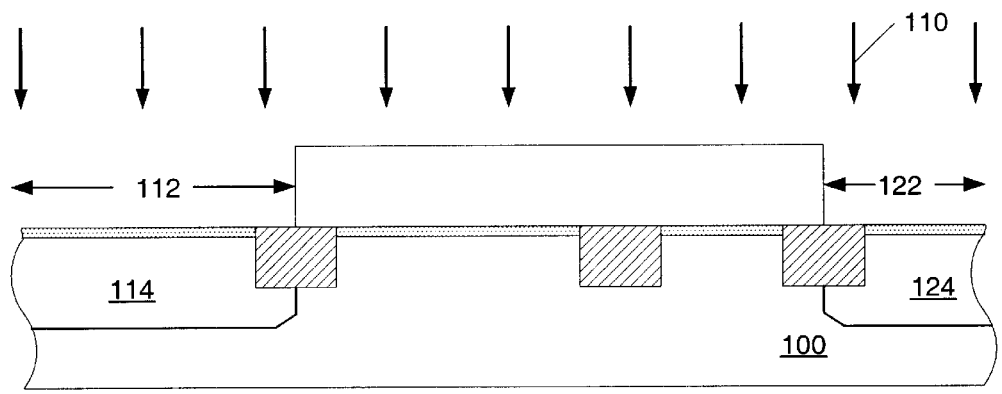
FIG. 5 depicts a partial cross-sectional view of the semiconductor topography in which first well impurities are introduced into the patterned layer and the exposed portion of the substrate subsequent to the formation of the patterned layer of FIG. 4.

FIG. 5 illustrates an introduction of well impurities 110 into patterned layer 109 and exposed portions of dielectric 108 and isolation regions 104 and 106 to form wells 114 and 124 within portions of substrate 100 underlying regions 112 and 122, respectively. Isolation regions 104 and 106 may preferentially block impurities 110, such that the depth of wells 114 and 124 may be reduced to some degree below isolation regions 104 and 106, respectively as shown in FIG. 5. Subsequent diffusion may smooth out any such depth variation, however. Well impurities 110 may include dopants of essentially one conductivity type, either n-type or p-type. In an embodiment in which n-type dopants are used, well impurities 110 may include, for example, phosphorus, arsenic, or antimony. By contrast, in an embodiment in which p-type dopants are used, well impurities 110 may include, for example, boron, boron difluoride, or indium.

The introduction of well impurities 110 may include an implant at a high enough energy to form wells 114 and 124 with a depth between approximately 0.5 microns and approximately 2.0 microns and a concentration between approximately $2.0 \times 10^{16}$ $cm^{-3}$ and approximately $2.0 \times 10^{18}$ $cm^{-3}$. Wells with larger or smaller depths and concentrations, however, may be formed depending on the design specifications of the device. In an alternative embodiment, the introduction of well impurities 110 may include a series of implants sufficient to create a well with specific depth and/or concentration profile. In some embodiments, wells 114 and 124 may be of the same depth and concentration. Alternatively, wells 114 and 124 may be of different depths and concentrations. In such an embodiment, additional patterned layers may be formed over regions 112 or 122 in between a series of impurity introductions such that underlying wells 114 or 124, respectively, may be formed with a lower concentration or depth.

Figure 6:
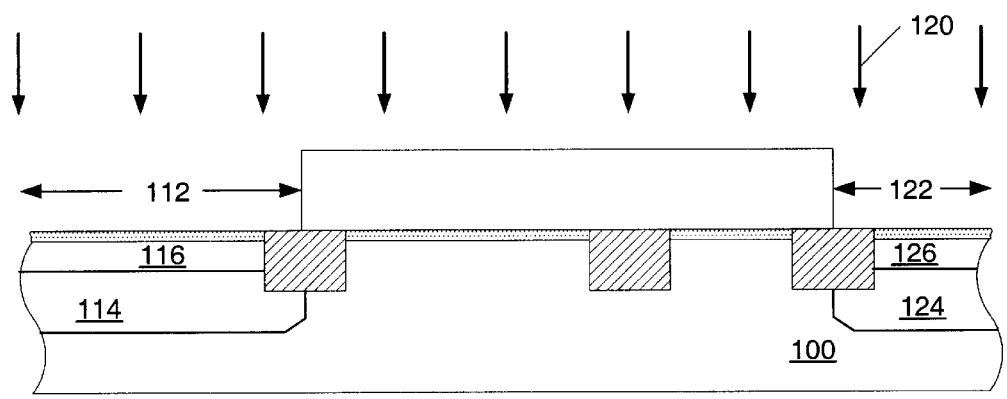
FIG. 6 depicts a partial cross-sectional view of the semiconductor topography in which first channel impurities are introduced into the patterned layer and the exposed portion of the substrate subsequent to the introduction of the first well impurities of FIG. 5.

The introduction of well impurities 110 may be followed by the introduction of channel impurities 120 as illustrated in FIG. 6. Such an introduction of impurities may form channel dopant regions 116 and 126 within wells 114 and 124, respectively. In general, channel dopant regions may serve to control punchthrough and short channel effects of subsequently formed transistors. Preferably, channel impurities 120 are of the same conductivity type as well impurities 110. As such, channel impurities 120 may include n-type dopants, such as phosphorus, arsenic, or antimony when n-type dopants are used for well impurities 110. Alternatively, channel impurities 120 may include p-type dopants, such as boron, boron difluoride, or indium when p-type dopants are used for well impurities 110. The introduction of channel impurities 120 may form channel dopant regions 116 and 126 with a peak concentration between approximately $2.0 \times 10^{16}$ $cm^{-3}$ and approximately $2.0 \times 10^{18}$ $cm^{-3}$ and depth between approximately 0.05 microns and approximately 0.25 microns. However, channel dopant regions of larger or smaller depths and concentrations may be formed depending on the design specifications of the device.

In one embodiment, impurities 120 may be introduced in a manner such that a threshold voltage magnitude of a subsequently formed transistor is above a desired value for that transistor. For example, impurities 120 may be introduced in a manner such that a threshold voltage magnitude of a transistor subsequently formed upon channel dopant region 116 is above a desired value. Such an introduction of impurities 120 may be sufficient such that a threshold voltage magnitude of transistor subsequently formed upon channel dopant region 126 may be within a desired range. In addition or alternatively, the introduction of channel impurities 120 may include implanting a large enough concentration of impurities to counteract the inverse narrow width effect of transistors subsequently formed upon channel dopant regions 116 and 126 when isolation regions 104 and 106 include trench isolation structures or fully recessed LOCOS isolation structures. In other words, the introduction of channel impurities 120 may include implanting a large enough concentration of impurities such that transistors subsequently formed upon channel dopant regions 116 and 126 may have a threshold voltage magnitude above a predetermined minimum.

Such an implantation may be particularly advantageous for the threshold voltage magnitude of a transistor subsequently formed upon channel dopant region 126, since the width of such a transistor may be less than a width of a transistor formed upon channel dopant region 116 and may be more apt to be affected by the inverse narrow width effect. Moreover, in order to effectively counteract the inverse narrow width effect of a transistor subsequently formed upon channel dopant region 126, the concentration of impurities introduced into channel dopant region 116 may be undesirably high. Consequently, a transistor subsequently formed upon channel dopant region 116 may have too large of a threshold voltage magnitude (i.e., above a desired value). The method described herein, however, may introduce additional dopants into channel dopant region 116 such that a transistor subsequently formed upon channel dopant region 116 may have a threshold voltage magnitude within a desired range. The introduction of such additional dopants is shown and described, in one embodiment, in FIG. 11 below.

In an alternative embodiment, the introduction of channel impurities 120 may be implanted at such a concentration that a transistor subsequently formed upon channel dopant region 116 may have a threshold voltage magnitude within the design specifications of the device. The introduction of such a concentration of impurities may cause the threshold voltage magnitude of a transistor subsequently formed upon channel dopant region 126 to be below a desired value. As such, additional impurities may be introduced into channel dopant region 126 to adjust the threshold voltage magnitude of a subsequently formed transistor. Such an introduction of additional impurities may be used to simultaneously adjust threshold voltage magnitudes of other subsequently fabricated transistors similar to the embodiment described in FIG. 11 below.

As with the formation of wells 114 and 124, channel dopant regions 116 and 126 may be formed by a single implant or a series of implants. In addition, channel dopant regions 116 and 126 may be of the same depth and concentration. Alternatively, channel dopant regions 116 and 126 may be of different depths and concentrations. In such an embodiment, additional patterned layers may be formed over region 112 or 122 in between a series of impurity introductions such that underlying channel dopant region 116 or 126 may be formed with a lower concentration or depth. Although the introduction of well impurities 110 in FIG. 5 are shown before the introduction of channel impurities 120 in FIG. 6, the introduction of such impurities may be reversed. As such, channel dopant regions 116 and 126 may be formed within substrate 100 before wells 114 and 124 are formed.

Figure 7:
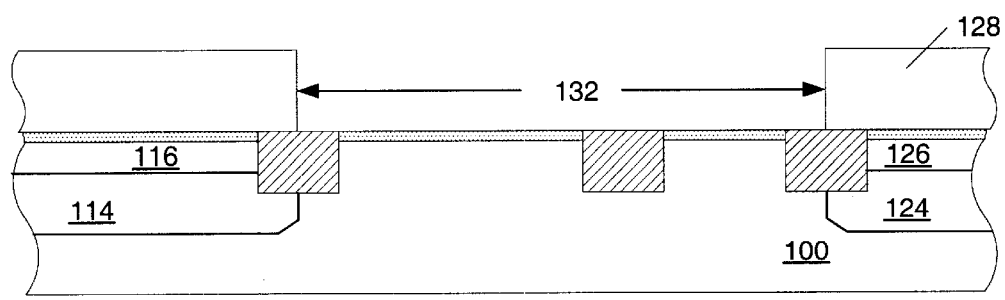
FIG. 7 depicts a partial cross-sectional view of the semiconductor topography in which the patterned layer is removed subsequent to the introduction of the first channel impurities of FIG. 6 and a different patterned layer is formed upon the substrate.

FIG. 7 illustrates the removal of patterned layer 109 and the formation of patterned layer 128. Patterned layer 109 may be removed by using stripping processes such as a wet etch or a reactive ion etch. Patterned layer 128 may be formed over substrate 100 such that region 132 of the semiconductor topography may be exposed. The formation of patterned layer 128 may be similar to the formation of patterned layer 109 in FIG. 4. Likewise, patterned layer 128 may serve to protect the underlying topography from subsequent processing. In addition, patterned layer 128 may include any of the materials that may be used for patterned layer 109 in FIG. 4.

Figure 8:
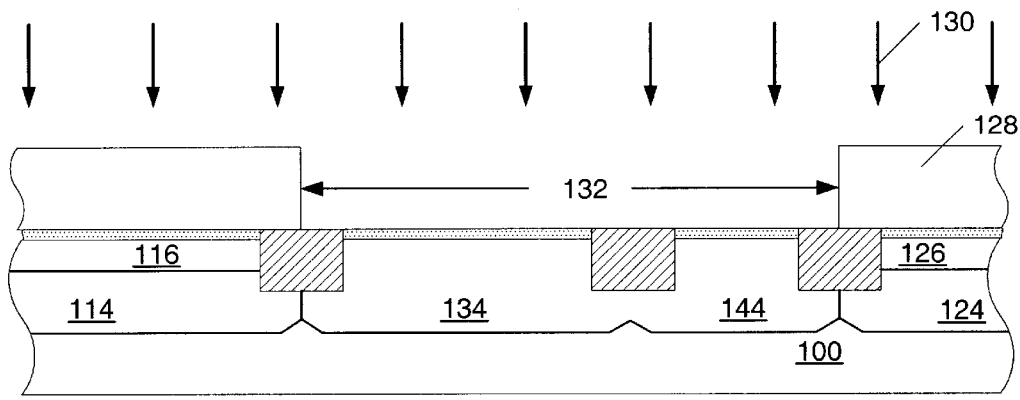
FIG. 8 depicts a partial cross-sectional view of the semiconductor topography in which second well impurities are introduced into the patterned layer and the exposed portion of the substrate subsequent to the formation of the patterned layer of FIG. 7.

After the formation of patterned layer 128, well impurities 130 may be introduced into patterned layer 128 and exposed region 132 to form wells 134 and 144 as shown in FIG. 8. Preferably, well impurities 130 are of the opposite conductivity type as well impurities 110 in FIG. 5. In this manner, transistors subsequently formed upon wells 134 and 144 may be of opposite conductivity type to transistors subsequently formed upon wells 114 and 124. For example, in an embodiment in which well impurities 110 include p-type dopants and well impurities 130 include n-type dopants, p-channel transistors may be formed upon wells 134 and 144 and n-channel transistors may be formed upon wells 114 and 124. The introduction of well impurities 130 may form wells 134 and 144 with a peak concentration between approximately $2.0 \times 10^{16}$ cm$^{-3}$ and approximately $2.0 \times 10^{18}$ cm$^{-3}$ and depth between approximately 0.5 microns and approximately 2.0 microns. Wells with larger or smaller depths and concentrations, however, may be formed depending on the design specifications of the device. In addition, wells 134 and 144 may be of the same depth and concentration. Alternatively, wells 134 and 144 may be of different depths and concentrations.

Figure 9:
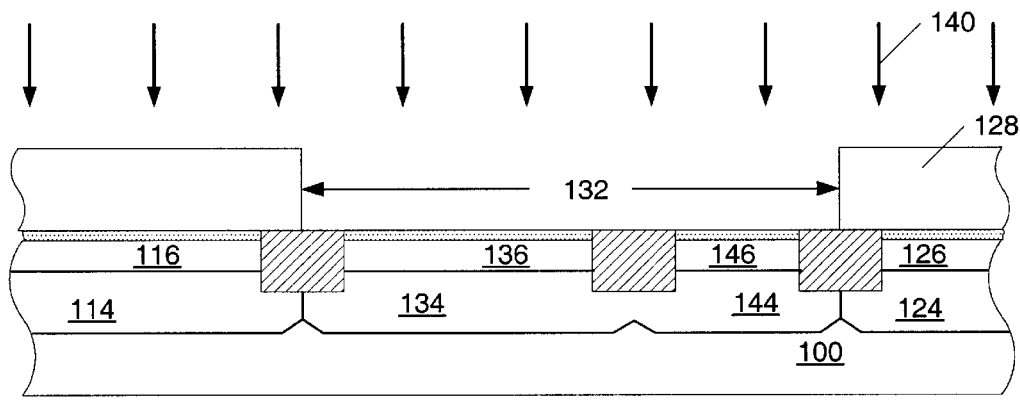
FIG. 9 depicts a partial cross-sectional view of the semiconductor topography in which second channel impurities are introduced into the patterned layer and the exposed portion of the substrate subsequent to the introduction of the second well impurities of FIG. 8.

As illustrated in FIG. 9, channel impurities 140 may be introduced into patterned layer 128 and exposed region 132 to form channel dopant regions 136 and 146 within wells 134 and 144, respectively. As with the formation of wells 134 and 144, channel dopant regions 136 and 146 may be formed by a single implant or a series of implants. In addition, channel dopant regions 136 and 146 may be of the same depth and concentration as each other. Alternatively, channel dopant regions 136 and 146 may be of different depths and concentrations. Although the introduction of well impurities 130 in FIG. 8 are shown before the introduction of channel impurities 140 in FIG. 9, the introduction of such impurities may be reversed. In this manner, channel dopant regions 136 and 146 may be formed within substrate 100 before wells 134 and 144 are formed. Preferably, channel impurities 140 are of the same conductivity type as well impurities 130. As such, channel impurities 140 may be of opposite conductivity type to well impurities 110 and channel impurities 120. The introduction of channel impurities 140 may form channel dopant regions 136 and 146 with a peak concentration between approximately $2.0 \times 10^{16}$ cm$^{-3}$ and approximately $2.0 \times 10^{18}$ cm$^{-3}$ and depth between approximately 0.05 microns and approximately 0.25 microns. Channel dopant regions with larger or smaller depths and concentrations, however, may be formed depending on the design specifications of the device.

In an embodiment in which the introduction of channel impurities 120 in FIG. 6 implants a large enough concentration of impurities such that a subsequently formed transistor is above a desired value, the introduction of channel impurities 140 may be implanted at such a concentration such that a transistor subsequently formed may have a threshold voltage magnitude below a desired value. For example, the introduction of channel impurities 140 may be implanted at such a concentration such that a transistor subsequently formed upon channel dopant region 146 may have a threshold voltage magnitude below a desired value. Since channel dopant region 136 is wider than channel dopant region 146, such an introduction of channel impurities 140 may cause the threshold voltage of channel dopant region 136 to be within a desired range. In such an embodiment, additional impurities may be introduced into channel dopant region 146 in order to increase the threshold voltage magnitude of a transistor subsequently formed upon channel dopant region 146. The introduction of the additional impurities is shown and described, in one embodiment, in FIG. 11 below.

In an alternative embodiment, impurities 140 may be introduced in a manner such that a threshold voltage magnitude of a subsequently formed transistor is above a desired value. For example, impurities 140 may be introduced in a manner such that a threshold voltage magnitude of a transistor subsequently formed upon channel dopant region 136 is above a desired value. In addition or alternatively, the introduction of channel impurities 140 may include implanting a large enough concentration of impurities to counteract the inverse narrow width effect of transistors subsequently formed upon channel dopant regions 136 and/or 146. In such embodiment, the introduction of channel impurities 120 in FIG. 6 preferably does not include implanting such a similarly large concentration. The introduction of channel impurities 140 at such a concentration may be particularly advantageous for the threshold voltage magnitude of a transistor subsequently formed upon channel dopant region 146, since the width of such a transistor may be less than a width of a transistor formed upon channel dopant region 136 and thus, may be more apt to be affected by the inverse narrow width effect. Moreover, in order to effectively counteract the inverse narrow width effect of a transistor subsequently formed upon channel dopant region 146, the concentration of impurities introduced into channel dopant region 136 may be undesirably high. Consequently, a transistor subsequently formed upon channel dopant region 136 may have too large of a threshold voltage magnitude (i.e., above a desired value).

The method described herein, however, may introduce additional dopants into channel dopant regions 136 such that a transistor may be subsequently formed with an appropriate threshold voltage magnitude. In some embodiments, the introduction of additional dopants may be used to simultaneously adjust threshold voltage magnitudes of other subsequently fabricated transistors. For example, in an embodiment in which channel impurities 120 are introduced at a concentration in FIG. 6 to cause the threshold voltage magnitude of a subsequently formed transistor on channel dopant region 126 to be too low, the introduction of the additional dopants used for adjusting the threshold voltage magnitude of a transistor on channel dopant region 136 may also be used to adjust the threshold voltage of the subsequently formed transistor on channel dopant region 126.

Figure 10:
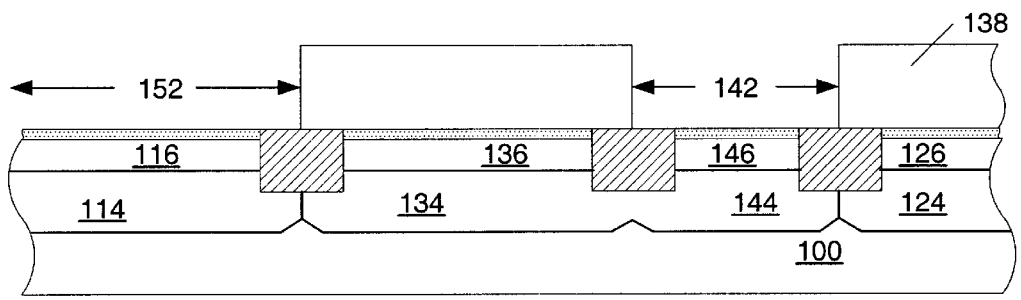
FIG. 10 depicts a partial cross-sectional view of the semiconductor topography in which the different patterned layer is removed subsequent to the introduction of the second channel impurities of FIG. 9 and an additional patterned layer is formed upon the substrate.
Figure 11:
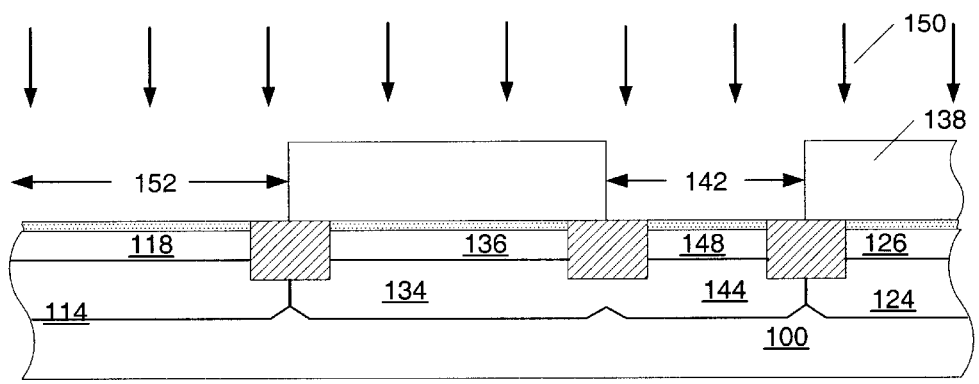
FIG. 11 depicts a partial cross-sectional view of the semiconductor topography in which compensation impurities are introduced into the patterned layer and the exposed portion of the substrate subsequent to the formation of the patterned layer of FIG. 10.

FIG. 10 illustrates the removal of patterned layer 128 and the formation of patterned layer 138. Patterned layer 128 may be removed by a similar process used to remove patterned layer 109. Likewise, the formation and composition of patterned layer 138 may be similar to the formation and composition of patterned layer 109. Patterned to layer 138 may be formed over substrate 100 such that regions 142 and 152 of the semiconductor topography may be exposed. After the formation of patterned layer 138, compensation dopants 150 may be introduced into region 142 and 152 to form channel dopant regions 118 and 148 as shown in FIG. 11. More specifically, the introduction of compensation dopants 150 may change the net concentration of electrically active impurities within channel dopant regions 116 and 146 to form channel dopant regions 118 and 148. In other words, the net concentration of electrically active impurities residing within channel dopant regions 116 and 146 may be modified to produce channel dopant regions 118 and 148. In some embodiments, the net concentration of electrically active impurities within channel dopant region 116 may be greater than the net concentration of electrically active impurities within the channel dopant region 146 prior to the introduction of compensation dopants 150.

In some cases, the introduction of compensation dopants 150 may simultaneously lower the threshold voltage magnitude of a transistor subsequently formed upon channel dopant region 118 and raise the threshold voltage magnitude of a transistor subsequently formed upon channel dopant region 148. In this manner, changing the net concentration of electrically active impurities within a channel dopant region may include changing the threshold voltage magnitude of a transistor subsequently formed upon the channel dopant region. Moreover, the introduction of compensation dopants 150 is preferably large enough to counteract the inverse narrow width effect of the threshold voltage magnitude of a transistor subsequently formed upon channel dopant region 148. The introduction of compensation dopants 150 may form channel dopant regions 118 and 148 with a peak concentration between approximately $2.0 \times 10^{16}$ cm$^{-3}$ and approximately $2.0 \times 10^{18}$ cm$^{-3}$ and depth between approximately 0.05 microns and approximately 0.25 microns. Channel dopant regions with larger or smaller depths and concentrations, however, may be formed depending on the design specifications of the device.

The change of the net concentration of electrically active impurities within channel dopant regions 116 and 146 may be an increase or a decrease depending on the to conductivity type of the compensation dopants and the net conductivity type of the respective channel dopant region. For example, compensation dopants 150 may be of the same conductivity type as channel dopants 140 of FIG. 9. As such, compensation dopants 150 may, in such an embodiment, be of the opposite conductivity type of the net conductivity type of channel dopant region 116 and the same conductivity type as the net conductivity type of channel dopant region 146. Consequently, the introduction of compensation dopants 150, in such an embodiment, may increase the concentration of impurities within channel dopant region 146 to form channel dopant region 148. For example, the concentration of impurities within channel dopant region 146 may increase by an amount between approximately 20% and approximately 100%.

Such an increase in concentration may increase the threshold voltage magnitude of a transistor subsequently formed over channel dopant region 148. For example, the threshold voltage magnitude of a transistor subsequently formed over channel dopant region 148 may increase by an amount between approximately 25 mV and approximately 300 mV with the introduction of compensation dopants 150. In addition or alternatively, such an increase is preferably sufficient to subsequently form a transistor over channel dopant region 148 with a threshold voltage magnitude within the design specifications of the device. In other words, compensation dopants 150 may be introduced at a sufficient concentration to compensate for the previous introduction of channel impurities 140, which may be introduced at a low enough concentration such that the threshold voltage magnitude of a transistor subsequently formed on channel dopant region 136 may be within design specifications of the device. Alternatively stated, channel dopants 140 in FIG. 9 may be introduced at a low enough concentration to allow for the subsequent introduction of compensation dopants 150 in FIG. 11. As such, the doses of channel dopants 140 and 150 are preferably sufficient to subsequently form a transistor over channel dopant region 148 with a threshold voltage magnitude within the design specifications of the device. In this manner, the dose of channel dopants 150 may be greater than the dose of channel dopants 140. Alternatively, the dose of channel dopants 140 may be greater than the dose of channel dopants 150.

In addition, the introduction of compensation dopants 150, in such an embodiment, may decrease the net concentration of electrically active impurities within channel dopant region 116 to form channel dopant region 118. Such a decrease in concentration may decrease the threshold voltage magnitude of a transistor subsequently formed over channel dopant region 118. In addition or alternatively, such a decrease in concentration is preferably sufficient to subsequently form a transistor over channel dopant region 118 with a threshold voltage magnitude within the design specifications of the device. In other words, compensation dopants 150 may be introduced at a sufficient concentration to compensate for the previous introduction of channel impurities 120. In such an embodiment, channel impurities 120 may be introduced in FIG. 6 at a high enough concentration such that the threshold voltage magnitude of a transistor subsequently formed upon channel dopant region 116 may be above a desired range. Alternatively stated, channel impurities 120 in FIG. 6 may be introduced at a high enough concentration to compensate for the subsequent introduction of compensation dopants 150 in FIG. 11. As such, a dose of channel impurities 120 may be larger than a dose of compensation dopants 150. Alternatively, the dose of channel impurities 120 may be smaller than a dose of compensation dopants 150. More specifically, the dose of the channel impurities 120 may be approximately 0.5 times smaller to approximately 2.0 times larger than the dose of the channel dopants 150. Larger or smaller dose variations may be appropriate, however, depending on the design specifications of the device.

In an alternative embodiment (not shown), patterned layer 138 of FIG. 10 may be formed above regions of substrate 100 containing channel dopant regions 116 and 146. In such an embodiment, regions of substrate 100 overlying channel dopant regions 136 and 126 may be exposed. In addition, compensation dopants 150, in such an embodiment, may be of the opposite conductivity type of channel dopants 140 of FIG. 9. As such, compensation dopants 150 may, in such an embodiment, be of the same conductivity type of the net conductivity type of channel dopant region 126 and the opposite conductivity type as the net conductivity type of channel dopant region 136. The introduction of compensation dopants 150, in such an embodiment, is preferably adapted to change the net concentration of electrically active impurities of channel dopant regions 136 and 126. Such a change in concentrations is preferably sufficient to subsequently form transistors with a threshold voltage magnitude within the design specifications of the device over channel dopant regions 136 and 126. Consequently, the introduction of compensation dopants 150, in such an embodiment, may decrease the net concentration of electrically active impurities within channel dopant region 136. In addition, the introduction of compensation dopants 150, in such an embodiment, may increase the concentration of impurities within channel dopant region 126. Such an embodiment may be particularly advantageous when channel impurities 120 and 140 are introduced in a manner such that threshold voltages of transistors subsequently formed upon channel dopant regions 116 and 146 may be within design specifications of the device.

In general, the method as described herein may include interchanging the introductions of dopants 120, 140, and 150 such that a threshold voltage magnitude of a first transistor subsequently formed within the substrate may be decreased while the threshold voltage magnitude of a second transistor subsequently formed within the substrate may be increased. As such, channel dopants 150 may be introduced prior to either of the channel dopants 120 and 140. In such an embodiment, the method may include introducing dopants into portions 142 and 152 of the substrate to form channel dopant regions. The introduction of the channel dopants 120 and 140, in such an embodiment, may be interchanged such that they are conducted before or after one another. In an embodiment in which dopants 120 include the opposite conductivity type of dopants 150, the introduction of dopants 120 may include changing the net conductivity type of one of the channel dopant regions created by the introduction of dopants 150. In an embodiment in which dopants 140 include the same conductivity type as dopants 150, dopants 140 may be introduced into another of the channel dopant regions created by the introduction of dopants 150 to raise the threshold voltage of the transistor subsequently formed within the channel dopant region. In addition, introduction of channel dopants 120 and 140 may include forming additional channel dopant regions of their respective conductivity type, such as channel dopant regions 126 and 136.

In an alternative embodiment, the introduction of dopants 150 may be introduced between the introduction of dopants 120 and 140. In this manner, the sequence of implantations may include the introduction of dopants 120 followed by the introduction of dopants 150 and 140, respectively. In such an embodiment, the introduction of dopants 150 may include lowering the threshold voltage magnitude of a transistor subsequently formed within channel dopant region 116 formed by the introduction of dopants 120. In addition, the introduction of dopants 150 may include introducing dopants into portion 142 of the substrate to form another channel dopant region of the opposite conductivity type as channel dopant region 116. The introduction of channel dopants 140 may follow to increase the threshold voltage magnitude of a transistor subsequently formed within the channel dopant region within portion 142 of the substrate. Such an introduction of channel dopants 140 may further include forming channel dopant region 136.

Alternatively, the sequence of implantations may include the introduction of dopants 140 followed by the introduction of dopants 150 and 120, respectively. In this manner, introduction of dopants 150 may include raising the threshold voltage magnitude of a transistor subsequently formed within channel dopant region 146 formed by the introduction of channel dopants 140. In addition, the introduction dopants 150 may include introducing dopants into portion 152 of the substrate to form another channel dopant region. The introduction of channel dopants 120 may follow to change the conductivity type of the channel dopant region formed within portion 152 of the substrate. In addition, the introduction of dopants 120 may form channel dopant region 126.

Consequently, the method described herein may form four distinct channel dopants regions. In particular, two narrow-width channel dopant regions (e.g., channel dopant regions 148 and 126) may be formed of opposite conductivity types. Likewise, two relatively wide channel dopant regions (e.g., channel dopant regions 118 and 136) may be formed of opposite conductivity types. The width of the narrow-width transistors may be at least approximately 2 times smaller than the width of the relatively wide transistors. In some embodiments, the width of the narrow-width transistors may be at least approximately 100 times smaller than the width of the relatively wide transistors. In addition, the two narrow-width channel dopant regions may have a higher net concentration of electrically active dopants than the relatively wide channel dopant regions. Furthermore, transistors with threshold voltage magnitudes within design specifications of the device may be fabricated on such channel dopant regions.

Figure 12:
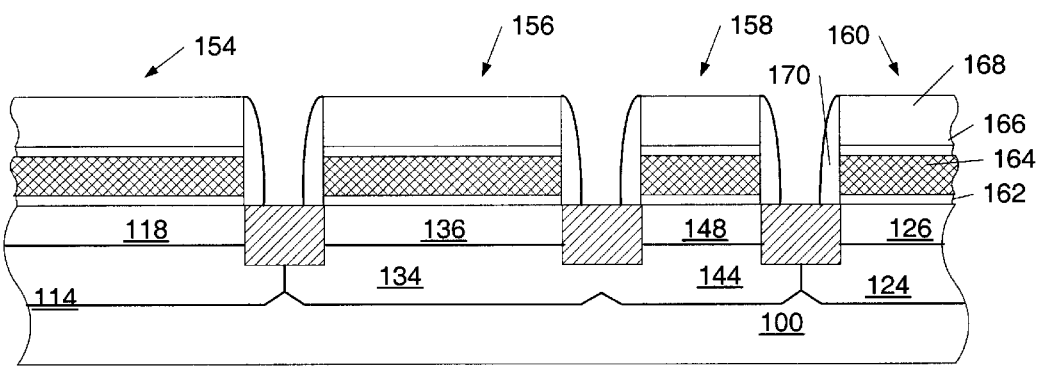
FIG. 12 depicts a partial cross-sectional view of the semiconductor topography in which any remaining patterned layer is removed subsequent to the introduction of the compensation impurities of FIG. 11 and transistors including gate structures and spacers are subsequently formed as a part of an integrated circuit.

After the formation of channel dopant regions 118, 136, 148, and 126, patterned layer 138 may be removed such that the upper surface of substrate 100 may be exposed. Patterned layer 138 may be removed in a similar manner that patterned layer 109 was removed. In addition, dielectric 108 may be removed such that an upper surface of substrate 100 is exposed. Moreover, gate structures 154, 156, 158, and 160 may be formed upon channel dopant regions 118, 136, 148, and 126, respectively as shown in FIG. 12. More specifically, gate dielectric 162, gate layer 164, conductive strapping layer 166, and insulating layer 168 may be formed upon substrate 100 and subsequently patterned to form gate structures 154, 156, 158, and 160. Gate dielectric 162 may include silicon dioxide ($SiO_2$), silicon nitride ($Si_xN_y$), silicon oxynitride ($SiO_xN_y(H_z)$), or silicon dioxide/silicon nitride/silicon dioxide (ONO). Alternatively, gate dielectric 162 may include metal oxides, such as aluminum oxide ($Al_2O_3$), titanium oxide ($TiO_2$), tantalum oxide ($Ta_2O_5$), hafnium oxide ($HfO_2$), and zirconium oxide ($ZrO_2$), or metal silicates. Gate layer 164 may include polysilicon, aluminum, copper, titanium, tungsten, or a metal alloy. In addition or alternatively, other materials typically used for gate dielectric materials and gate conducting materials in the fabrication of semiconductor devices may be used for gate dielectric 162 and gate layer 164, respectively.

Conductive strapping layer 166 may be used to strap gate regions of opposite conductivity type together. For example, strapping layer 166 may provide a conductive path across a p-n junction formed when a polysilicon connection is made to gates of opposite conductivity type. The strapping layer may also serve to reduce gate resistance. Strapping layer 166 may include a low-resistivity material, such as tungsten, tungsten silicide, cobalt silicide, titanium silicide, or nickel silicide. Alternatively, strapping layer 166 may be omitted from the gate structures of FIG. 12. In some cases, a diffusion barrier layer (not shown) may be formed between gate layer 164 and strapping layer 166. Such a layer may prevent the impurities in gate layer 164 from diffusing into strapping layer 166. The diffusion barrier layer may include materials, such as undoped polysilicon, silicon oxide, silicon nitride, tungsten nitride, and titanium nitride. Insulating layer 168 may be deposited upon strapping layer 166 or upon gate layer 164 if strapping layer 166 has been omitted. Insulating layer 168 may include a dielectric material such as, silicon dioxide, silicon nitride, silicon oxynitride, or silicon dioxide/silicon nitride/silicon dioxide.

Gate structures 154, 156, 158, and 160 may be used to form transistors of differing widths and/or conductivity types. For example, the widths of gate structures 154 and 156 may be substantially equal, however, gate structure 154 may form an n-channel transistor and gate structure 156 may form a p-channel transistor or vice versa. Likewise, the widths of gate structures 158 and 160 may be substantially equal, however, gate structure 158 may form an n-channel transistor and gate structure 160 may form a p-channel transistor or vice versa. To form such transistors, spacers 170 may be formed adjacent to the sidewalls of gate structures 154, 156, 158, and 160 as shown in FIG. 12. In addition, source/drain regions may be formed within channel dopant regions 118, 136, 148, and 126 self-aligned to gate structures 154, 156, 158, and 160, respectively. Since the cross-sectional view of FIG. 12 is taken along the width of the transistors, such source/drain regions are not shown.

Figure 13:
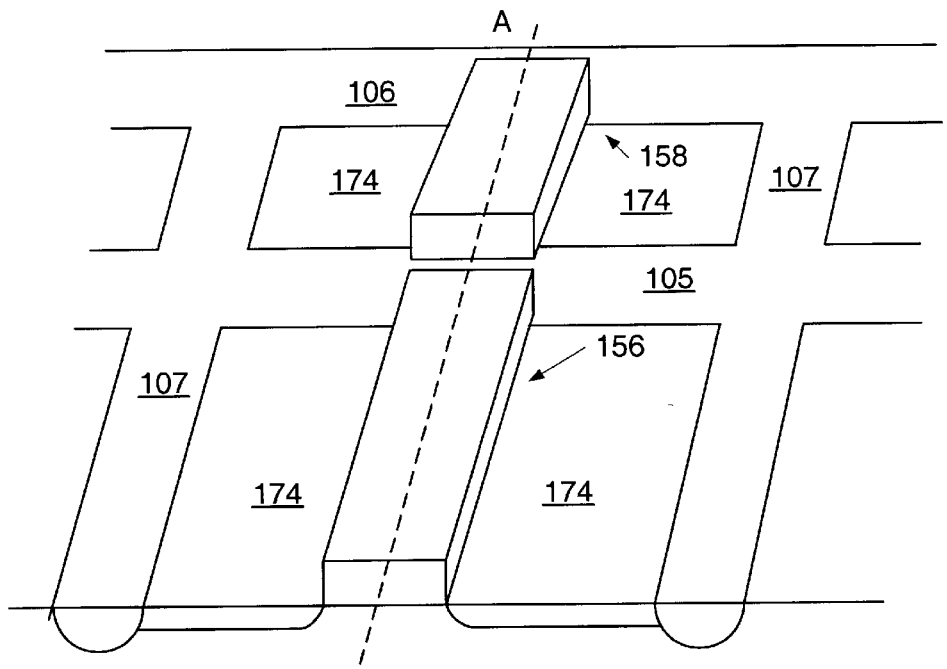
FIG. 13 depicts a partial perspective view of the semiconductor topography subsequent to the formation of the transistors of FIG. 12.

However, FIG. 13 shows a partial perspective view of the transistors including gate structures 156 and 158. As such, source/drain regions 174 are shown within substrate 100 self-aligned to gate structures 156 and 158. In an embodiment, source/drain regions 174 may include extensions and/or halos formed below spacers 170 (not shown in FIG. 13 for clarity purposes). In addition, the transistors shown in FIG. 13 are bound by isolation regions 105, 106, and 107. Isolation regions 107 may be arranged along the length of source/drain regions 174 in order to separate the transistors from transistors formed on either side of source/drain regions 174. The cross-sectional view of FIG. 12 may be taken, for example, along line A of FIG. 13. In this manner, the width of the transistors may be defined as the width of the active regions. More specifically, the width of the transistors may be defined by the width of the active regions taken along line A. Consequently, the transistor including gate structure 156 is significantly wider than the transistor including gate structure 158.

In an embodiment, the transistors shown in FIGS. 12 and 13 may form at least part of an integrated circuit. Such an integrated circuit may include, in an embodiment, a first transistor with channel dopant region 118 having implanted impurities of both conductivity types. More specifically, channel dopant region 118 may include a greater concentration of implanted impurities of one conductivity type than a concentration of implanted impurities of the other conductivity type. In addition, the integrated circuit may include a second transistor with channel dopant region 148 having implanted impurities of the other conductivity type. In such an embodiment, a width of the second transistor may be smaller than a width of the first transistor. Furthermore, the integrated circuit may include a third transistor with channel dopant region 126 having implanted impurities of the one conductivity type. In addition, a width of the third transistor may be smaller than the width of the first transistor. In addition or alternatively, the first and third transistors may include non-memory transistors. The integrated circuit may further include a fourth transistor with channel dopant region 136 having implanted impurities of the other conductivity type. In such an embodiment, a width of the fourth transistor may be larger than the width of the second transistor. In addition or alternatively, the second and fourth transistors may include memory cell transistors.

Other embodiments of the method described herein may include alternative process steps or sequences. In particular, the sequence of the process steps in FIGS. 4–9 may be rearranged. More specifically, the sequence of process steps in FIGS. 7–9 may be performed prior to the sequence of process steps in FIGS. 4–6. For example, wells 134 and 144 and channel dopant regions 136 and 146 may be formed prior to wells 114 and 124 and channel dopant regions 116 and 126. Other embodiments for forming such wells and channel dopant regions are described and illustrated in FIGS. 14–17 below.

Figure 14:
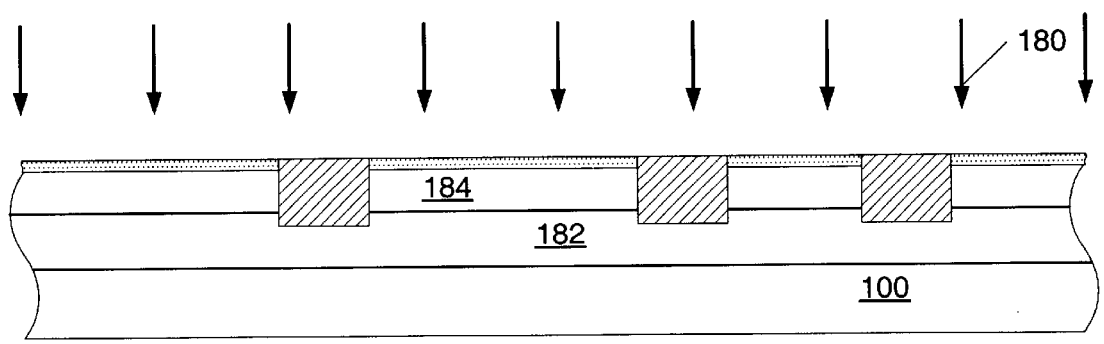
FIG. 14 depicts a partial cross-sectional view of the semiconductor topography, in a different embodiment, in which impurities are introduced into the substrate without a patterned layer subsequent to the oxide layer formation of FIG. 3.
Figure 15:
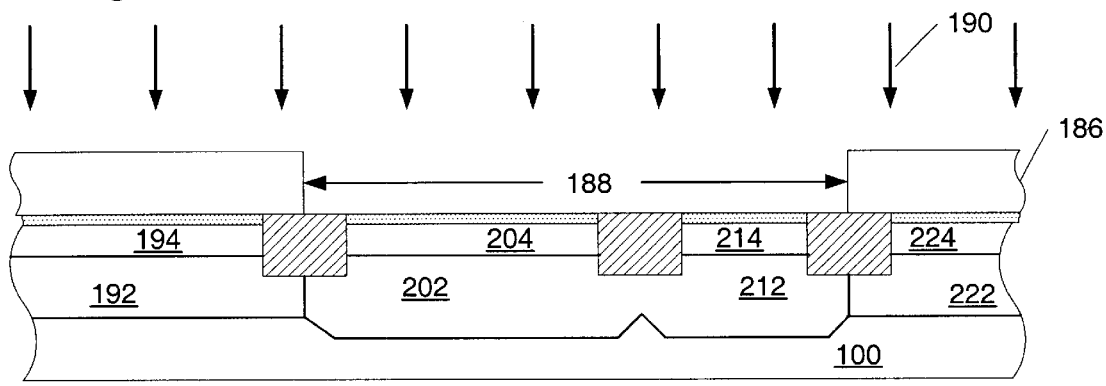
FIG. 15 depicts a partial cross-sectional view of the semiconductor topography in which a patterned layer is formed subsequent to the introduction of impurities of FIG. 14 and further impurities are introduced into the patterned layer and exposed portions of the substrate.

In an embodiment, a method for the formation of channel dopant regions within an integrated circuit may follow the process steps of FIGS. 14 and 15. Subsequent to FIG. 3, FIG. 14 illustrates the introduction of impurities 180 into substrate 100 without a patterned layer to form well 182 and channel dopant region 184. In this manner, well 182 and channel dopant region 184 may be formed within the entire upper lateral portion of substrate 100 as illustrated in FIG. 14. Although, the introduction of impurities 180 is shown in a single step, the formation of well 182 and channel dopant region 184 may be performed by two separate implantations. In addition, the formation of each of well 182 and channel dopant region 184 may be formed by a single or a series of implantations. In some embodiments, well 182 may be formed prior to channel dopant region 184. Alternatively, channel dopant region 184 may be formed before the well 182.

In an embodiment, impurities 180 may be the same conductivity type of well dopants 110 and channel impurities 120 of FIGS. 5 and 6, respectively. Alternatively, impurities 180 may be the opposite conductivity type of well dopants 110 and channel impurities 120. Well 182 may have a depth between approximately 0.5 microns and 2.0 microns and a concentration between approximately $2.0 \times 10^{16}$ cm$^{-3}$ and approximately $2.0 \times 10^{18}$ cm$^{-3}$. However, larger or smaller depths and concentrations of well 182 may be appropriate depending on the semiconductor device being formed. Channel dopant region 184 may have a peak concentration between approximately $2.0 \times 10^{16}$ cm$^{-3}$ and approximately $2.0 \times 10^{18}$ cm$^{-3}$ and depth between approximately 0.05 microns and approximately 0.25 microns. Channel dopant regions with larger or smaller depths and concentrations, however, may be formed depending on the design specifications of the device.

FIG. 15 shows the formation of patterned layer 186 and the introduction of impurities 190. Patterned layer 186 may be formed over substrate 100 exposing region 188. The formation and composition of patterned layer 186 may be similar to the formation and composition of patterned layer 109 in FIG. 5. Impurities 190 may be introduced into patterned layer 186 and exposed portions of substrate 100 underlying region 188 to form wells 202 and 212 and channel dopant regions 204 and 214. Although, the introduction of impurities 190 is shown in a single step, the formation of wells 202 and 212 and channel dopant regions 204 and 214 may be conducted with two or more separate implantations. In addition, wells 202 and 212 may be formed prior to channel dopant regions 204 and 214 or vice versa. Patterned layer 186 preferably prevents the introduction of impurities 190 into underlying regions of substrate 100. However, portions of well 182 and channel dopant region 184 underlying patterned layer 186 have been renumbered in FIG. 15 as wells 192 and 222 and channel dopant regions 194 and 224 to distinguish the different widths of their respective active regions. In this manner, transistors of different widths subsequently formed upon such regions may be referenced.

Channel dopant regions 204 and 214 may have a peak concentration between approximately $2.0 \times 10^{16}$ cm$^{-3}$ and approximately $2.0 \times 10^{18}$ cm$^{-3}$ and depth between approximately 0.05 microns and approximately 0.25 microns. Channel dopant regions with larger or smaller depths and concentrations, however, may be formed depending on the design specifications of the device. Wells 202 and 212 may have depths between approximately 0.5 microns and 2.0 microns and a concentration between approximately $2.0 \times 10^{16}$ cm$^{-3}$ and approximately $2.0 \times 10^{18}$ cm$^{-3}$. However, larger or smaller depths and concentrations of wells 202 and 212 may be appropriate depending on the semiconductor device being formed. In an embodiment, wells 202 and 212 may be formed to a depth greater than or equal to wells 192 and 222 to avoid formation of a region doped with impurities 180 underlying wells 202 and 212. Such a region could short-circuit wells 192 and 222. In an embodiment in which wells 202 and 212 and the substrate are of the same conductivity type, the formation of a region doped with impurities 180 underlying wells 202 and 212 may also cause high resistance between wells 202 and 212 and the substrate. However, in some applications, high resistance and/or short-circuiting may be desirable. Therefore, wells 202 and 212 may, in some embodiments, be formed to a depth less than wells 192 and 222.

Preferably, impurities 190 are of the opposite conductivity type as impurities 180. Furthermore, channel impurities 190 may be introduced in a manner such that the net conductivity type of channel dopant regions 204 and 214 may be opposite of channel dopant regions 194 and 224. As such, channel impurities 180 of FIG. 14 may be introduced at a low enough concentration to be compensated by the subsequent introduction of channel impurities 190. In other words, channel impurities 190 may be introduced at a high enough concentration to compensate for the previous introduction of channel impurities 180. As such, a dose of channel impurities 190 may be larger than a dose of channel impurities 180. Alternatively, a dose of channel impurities 190 may be smaller than a dose of channel impurities 180. More specifically, the dose of the channel impurities 190 may be approximately 0.5 times smaller to approximately 2.0 times larger than the dose of the channel impurities 180. Larger or smaller dose variations may be appropriate, however, depending on the design specifications of the device.

Moreover, in one embodiment, impurities 180 may be introduced in a manner such that a threshold magnitude of a subsequently formed transistor is above a desired value. For example, impurities 180 may be introduced in a manner such that a threshold voltage magnitude of a transistor subsequently formed upon channel dopant region 194 may be above a desired value. In such an embodiment, impurities 190 may be introduced in a manner such that a threshold voltage magnitude of another subsequently formed transistor is below a desired value. For instance, impurities 190 may be introduced in a manner such that a threshold voltage magnitude of a transistor subsequently formed upon channel dopant region 214 may be below a desired value. Alternatively, impurities 190 may be introduced in a manner such that a threshold magnitude of a subsequently formed transistor may be above a desired value and impurities 180 may be introduced in a manner such that a threshold magnitude of another subsequently formed transistor may be below a desired value. The method may resume with the process step of FIG. 10, in which a patterned layer may be formed over substrate 100 such that compensation dopants 150 may be introduced into some of the channel dopant regions to adjust the threshold voltage magnitude of subsequently formed transistors.

Figure 16:
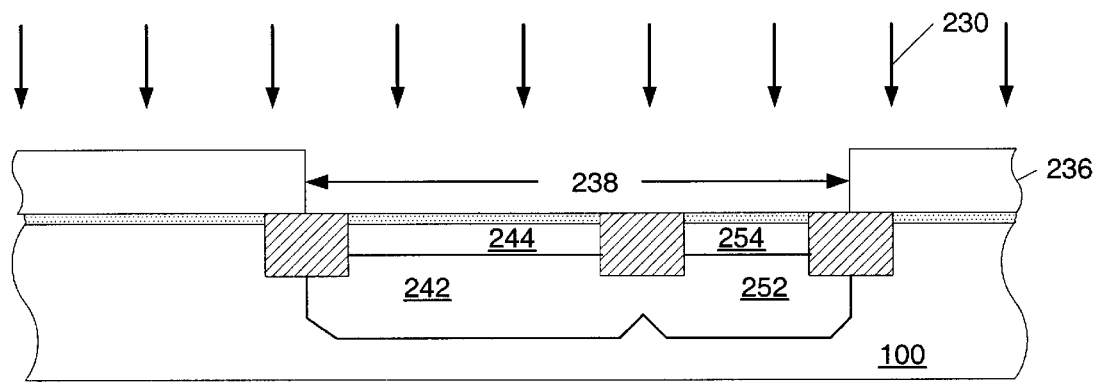
FIG. 16 depicts a partial cross-sectional view of the semiconductor topography, in an alternative embodiment, in which a patterned layer is formed subsequent to the oxide layer formation of FIG. 3 and impurities are introduced into the patterned layer and exposed portions of the substrate.
Figure 17:
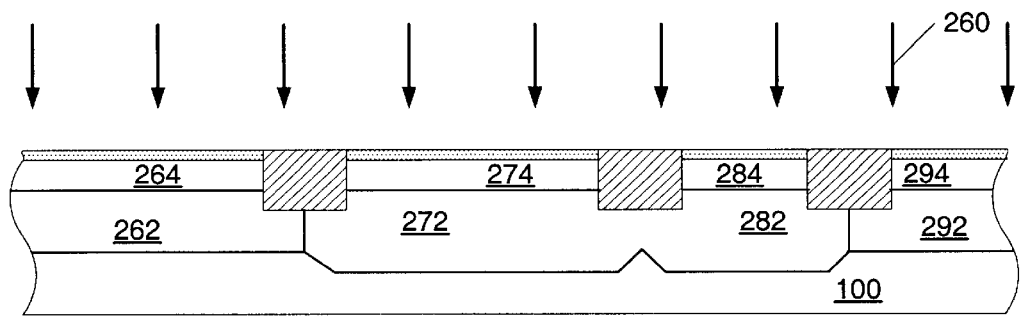
FIG. 17 depicts a partial cross-sectional view of the semiconductor topography in which the patterned layer is removed subsequent to the introduction of impurities of FIG. 16 and further impurities are introduced into the substrate without a patterned layer.

FIGS. 16 and 17 illustrate an alternative embodiment for forming channel dopant regions within an integrated circuit. In particular, FIG. 16 illustrates the formation of patterned layer 236 and the introduction of impurities 230 subsequent to FIG. 3. Patterned layer 236 may be formed over substrate exposing region 238. The formation and composition of patterned layer 236 may be similar to the formation and composition of patterned layer 109 in FIG. 5. Impurities 230 may be introduced into patterned layer 236 and exposed portions of substrate 100 underlying region 238 to form wells 242 and 252 and channel dopant regions 244 and 254. Although, the introduction of impurities 230 is shown in a single step, the formation of wells 242 and 252 and channel dopant regions 244 and 254 may be performed by two or more separate implantations. In addition, wells 242 and 252 may be formed prior to channel dopant regions 244 and 254 or vice versa. Wells 242 and 252 may have depths between approximately 0.5 microns and 2.0 microns and a concentration between approximately $2.0 \times 10^{16}$ cm$^{-3}$ and approximately $2.0 \times 10^{18}$ cm$^{-3}$. However, larger or smaller depths and concentrations of wells 242 and 252 may be appropriate depending on the semiconductor device being formed. Channel dopant regions 244 and 254 may have a peak concentration between approximately $2.0 \times 10^{16}$ cm$^{-3}$ and approximately $2.0 \times 10^{18}$ cm$^{-3}$ and depth between approximately 0.05 microns and approximately 0.25 microns. Channel dopant regions with larger or smaller depths and concentrations, however, may be formed depending on the design specifications of the device.

FIG. 17 illustrates the removal of patterned layer 236 and the introduction of impurities 260. Patterned layer 236 may be removed by using stripping processes such as a wet etch or a reactive ion etch. Impurities 260 may be introduced into substrate 100 without a patterned layer to form wells 262, 272, 282, and 292. In addition, channel dopant regions 264, 274, 284, and 294 may be formed by the introduction of impurities 260. Although, the introduction of impurities 260 is shown in a single step, the formation of wells 262, 272, 282, and 292 and channel dopant regions 264, 274, 284, and 294 may be conducted in two or more separate implantations. In one embodiment, wells 262, 272, 282, and 292 may be formed prior to channel dopant regions 264, 274, 284, and 294. Alternatively, channel dopant regions 264, 274, 284, and 294 may be formed before the wells 262, 272, 282, and 292.

The introduction of impurities 260 without a patterned layer over a portion of substrate 100 may allow such impurities to be introduced across the entire upper lateral portion of substrate 100. As such, in addition to forming new wells 262 and 292 and channel dopant regions 264 and 294, the net concentration of electrically active impurities within wells 242 and 252 and channel dopant regions 244 and 254 may be changed. In particular, the change in the net concentration of electrically active impurities within wells 242 and 252 and channel dopant regions 244 and 254 may form wells 272 and 282 and channel dopant regions 274 and 284. In a preferred embodiment, impurities 260 are of opposite conductivity type of impurities 230. In addition, impurities 260 are preferably introduced into substrate 100 such that the net conductivity type of wells 242 and 252 and channel dopant regions 244 and 254 is maintained. In other words, impurities 260 are preferably introduced into substrate 100 such that the net conductivity type of wells 242 and 252 and channel dopant regions 244 and 254 are opposite of impurities 260. As such, channel impurities 260 may be introduced at a low enough concentration to compensate for the previous introduction of channel impurities 230 of FIG. 16. In other words, channel impurities 230 may be introduced at a high enough concentration to compensate for the subsequent introduction of channel impurities 260. Consequently, a dose of channel impurities 230 may be larger than a dose of channel impurities 260. Alternatively, channel impurities 230 may be smaller than a dose of channel impurities 260. More specifically, the dose of the channel impurities 230 may be approximately 0.5 times smaller to approximately 2.0 times larger than the dose of the channel impurities 260. Larger or smaller dose variations may be appropriate, however, depending on the design specifications of the device.

Moreover, in one embodiment, impurities 260 may be introduced in a manner such that a threshold magnitude of a subsequently formed transistor is above a desired value. For example, impurities 260 may be introduced in a manner such that a threshold voltage magnitude of a transistor subsequently formed upon channel dopant region 264 is above a desired value. In such an embodiment, impurities 230 may be introduced in a manner such that a threshold voltage magnitude of another subsequently formed transistor is below a desired value. For instance, impurities 230 may be introduced in a manner such that a threshold voltage magnitude of a transistor subsequently formed upon channel dopant region 254 may be below a desired value. Alternatively, impurities 230 may be introduced in a manner such that a threshold magnitude of a subsequently formed transistor is above a desired value and impurities 260 may be introduced in a manner such that a threshold magnitude of another subsequently formed transistor is below a desired value.

Channel dopant regions 264, 274, 284, and 294 may have a peak concentration between approximately $2.0\times10^{16}$ cm$^{-3}$ and approximately $2.0\times10^{18}$ cm$^{-3}$ and depth between approximately 0.05 microns and approximately 0.25 microns. Channel dopant regions with larger or smaller depths and concentrations, however, may be formed depending on the design specifications of the device. Wells 262, 272, 282, and 292 may have a depth between approximately 0.5 microns and 2.0 microns and a concentration between approximately $2.0\times10^{16}$ cm$^{-3}$ and approximately $2.0\times10^{18}$ cm$^{-3}$. However, larger or smaller depths and concentrations of wells 262, 272, 282, and 292 may be appropriate depending on the semiconductor device being formed.

In an embodiment, impurities 260 may be introduced in a manner such that the depth of wells 262 and 292 may be formed to a depth less than or equal to wells 272 and 282 to avoid formation of a region doped with impurities 260 underlying wells 272 and 282. Such a region could short-circuit wells 262 and 292. In an embodiment in which wells 272 and 282 and the substrate are of the same conductivity type, the formation of a region doped with impurities 260 underlying wells 272 and 282 may also cause high resistance between well 272 and 282 and the substrate. However, in some applications, high resistance and/or short-circuiting may be desirable. Therefore, wells 262 and 292 may in some embodiments be formed to a depth greater than wells 272 and 282. The method may resume with the process step of FIG. 10, in which a patterned layer may be formed over substrate 100 such that compensation dopants 150 may be introduced into some of the channel dopant regions to adjust the threshold voltage magnitude of subsequently formed transistors.

It will be appreciated to those skilled in the art having the benefit of this disclosure that this invention is believed to provide a method and a system for processing a semiconductor topography. Further modifications and alternative embodiments of various aspects of the invention will be apparent to those skilled in the art in view of this description. For example, each implant may include a single implant or a series of implants using various species, energies, and doses to optimize the resulting profile. Furthermore, a thermal anneal may follow any of the implants to electrically activate and/or diffuse the dopants. Such an anneal process may be activated immediately after each implant, or the various implant anneals may be combined into one or more steps later in the process. It is intended that the following claims be interpreted to embrace all such modifications and changes and, accordingly, the drawings and the specification are to be regarded in an illustrative rather than a restrictive sense.

What is claimed is:

1. A method of processing a semiconductor substrate, comprising:
   performing a first implantation corresponding to a threshold voltage magnitude above a desired value for a first transistor to form channel dopant regions for the first transistor and a third transistor, wherein the first transistor and the third transistor contain different amounts of channel impurities; and
   performing a second implantation to simultaneously lower the threshold voltage magnitude of the first transistor and raise a threshold voltage magnitude of a second transistor.

2. The method of claim 1, further comprising a third implantation prior to the second implantation, wherein the third implantation corresponds to a threshold voltage magnitude below a desired value of the second transistor.

3. The method of claim 2, wherein the step of performing the first implantation comprises introducing dopants of a first conductivity type into exposed portions of the semiconductor substrate to form the channel dopant region for the first transistor.

4. The method of claim 3, wherein said performing the third implantation comprises introducing dopants of a second conductivity type into the exposed portions of the semiconductor substrate to form a channel dopant region for the second transistor, wherein the second conductivity type is opposite of the first conductivity type.

5. The method of claim 4, wherein a dose of the dopants of the first conductivity type is approximately 0.5 times smaller to approximately 2.0 times larger than a dose of the dopants of the second conductivity type.

6. The method of claim 4, wherein the step of performing the second implantation comprises introducing dopants of the second conductivity type into the channel dopant regions of the first and second transistors.

7. The method of claim 1, wherein the step of performing the second implantation comprises implanting a large enough concentration of impurities to counteract an inverse narrow width effect on the threshold voltage magnitude of the second transistor.

8. A method for processing a semiconductor substrate, comprising decreasing the threshold voltage magnitude of a first transistor being formed within the substrate while simultaneously increasing the threshold voltage magnitude of a second transistor being formed within the substrate, wherein a width of the first transistor is larger than a width of the second transistor.

9. The method of claim 8, wherein said decreasing the threshold voltage magnitude comprises decreasing a net concentration of electrically active impurities of a first conductivity type within a channel dopant region of the first transistor.

10. The method of claim 8, wherein said increasing the threshold voltage magnitude comprises increasing the concentration of impurities of a second conductivity type within a channel dopant region of the second transistor.

11. The method of claim 10, wherein said increasing the concentration of impurities comprises increasing the concentration of impurities by an amount between approximately 20% and approximately 100%.

12. The method of claim 8, wherein said increasing the threshold voltage magnitude comprises increasing the threshold voltage magnitude of the second transistor by an amount between approximately 25 mV and approximately 300 mV.

13. The method of claim 8, wherein said second transistor is a memory cell transistor, and wherein said first transistor is a non-memory cell transistor.

14. The method of claim 8, wherein the width of the first transistor is at least approximately 2 times larger than the width of the second transistor.

15. A method for processing a semiconductor substrate, comprising introducing compensation dopants of a first conductivity type into a first transistor channel dopant region and a second transistor channel dopant region simultaneously, wherein a net concentration of electrically active impurities within the first transistor channel dopant region is greater than a net concentration of electrically active impurities within the second transistor channel dopant region prior to said introducing, and wherein the width of the first transistor is larger than the width of the second transistor.

16. The method of claim 15, wherein the impurities of the first transistor channel dopant region comprise a net conductivity type opposite to that of the compensation dopants, and wherein the impurities of the second transistor channel dopant region comprise the same net conductivity type as the compensation dopants.

17. The method of claim 15, further comprising:

introducing first channel dopants of the first conductivity type into the semiconductor substrate to form the first transistor channel dopant region and a third transistor channel dopant region of the same conductivity type as the first transistor channel dopant region; and introducing second channel dopants of a second conductivity type into the semiconductor substrate to form the second transistor channel dopant region and a fourth transistor channel dopant region of the same conductivity type as the second transistor channel dopant region, wherein said second conductivity type is opposite to that of the first conductivity type.

18. The method of claim 17, further comprising forming a patterned layer over the second transistor channel dopant region and the fourth transistor channel dopant region prior to the introducing the first channel dopants.

19. The method of claim 17, further comprising forming a patterned layer over the first transistor channel dopant region and the third transistor channel dopant region prior to the introducing the second channel dopants.

20. The method of claim 17, further comprising forming a patterned layer over the third transistor channel dopant region and the fourth transistor channel dopant region prior to the introducing the compensation dopants.

21. The method of claim 17, wherein the step of introducing first and second channel dopants comprises implanting, and wherein a dose of the first channel dopants is larger than a dose of the second channel dopants.

22. The method of claim 15, wherein the step of introducing compensation dopants comprises increasing the threshold voltage magnitude of a subsequently formed transistor arranged above the second transistor channel dopant region by an amount between approximately 25 mV and approximately 300 mV.

23. The method of claim 22, wherein the step of introducing compensation dopants further comprises decreasing the threshold voltage magnitude of a subsequently formed transistor arranged above the first transistor channel dopant region.

24. The method of claim 15, wherein the step of introducing compensation dopants comprises increasing the net concentration of the second transistor channel dopant region by an amount between approximately 20% and approximately 100%.

* * * * *